United States Patent
Orava et al.

(10) Patent No.: US 6,215,123 B1
(45) Date of Patent: Apr. 10, 2001

(54) FORMING CONTACTS ON SEMICONDUCTOR SUBSTRATES, RADIATION DETECTORS AND IMAGING DEVICES

(75) Inventors: Risto O. Orava, Helsinki; Jouni I. Pyyhtiä, Vantaa; Tom G. Schulman, Masala, all of (FI); Miltiadis E. Sarakinos, Geneva (CH); Konstantinos E. Spartiotis; Panu Y. Jalas, both of Helsinki (FI)

(73) Assignee: Simage Oy, Espoo (FI)

( * ) Notice: Subject to any disclaimer, the term of this patent is extended or adjusted under 35 U.S.C. 154(b) by 0 days.

(21) Appl. No.: 09/421,115

(22) Filed: Oct. 19, 1999

Related U.S. Application Data

(62) Division of application No. 08/755,826, filed on Nov. 26, 1996, now Pat. No. 6,046,068.

(30) Foreign Application Priority Data

Nov. 29, 1995 (GB) ................................. 9524387

(51) Int. Cl.⁷ ..................................... G01T 1/24
(52) U.S. Cl. ................. 250/370.13; 250/370.09
(58) Field of Search ................ 250/370.01, 370.08, 250/370.09, 370.12, 370.13

(56) References Cited

U.S. PATENT DOCUMENTS

| 4,369,458 | 1/1983 | Thomas et al. |
| 4,692,782 | * 9/1987 | Seki et al. ........................ 357/29 |
| 5,786,597 | * 7/1998 | Lingren et al. .............. 250/370.09 |

FOREIGN PATENT DOCUMENTS

| 0 415 541 | 3/1991 | (EP) . |
| 0 642 038 | 3/1995 | (EP) . |
| 2-040968 | 2/1990 | (JP) . |
| 2-232978 | 9/1990 | (JP) . |

* cited by examiner

*Primary Examiner*—Constantine Hannaher
*Assistant Examiner*—Albert Gagliardi
(74) *Attorney, Agent, or Firm*—Kenyon & Kenyon

(57) ABSTRACT

A method, suitable for forming metal contacts on a semiconductor substrate at positions for defining radiation detector cells, includes the steps of forming one or more layers of material on a surface of the substrate with openings to the substrate surface at the contact positions; forming a layer of metal over the layer(s) of material and the openings; and removing metal overlying the layer(s) of material to separate individual contacts. Optionally, a passivation layer to be left between individual contacts on the substrate surface may be applied. Etchants used for removing unwanted gold (or other contact matter) are preferably prevented from coming into contact with the surface of the substrate, thereby avoiding degradation of the resistive properties of the substrate.

15 Claims, 10 Drawing Sheets

FORMING CONTACTS ON SEMICONDUCTOR SUBSTRATES, RADIATION DETECTORS AND IMAGING DEVICES

This is a divisional of application Ser. No. 08/755,826, filed on Nov. 26, 1996, now U.S. Pat. No. 6,046,068.

BACKGROUND OF THE INVENTION

1. Field of the Invention

The invention relates to methods for manufacturing radiation detectors and radiation imaging devices, radiation detectors and imaging devices manufactured by such methods, and the use of such radiation detectors and imaging devices.

2. Description of the Prior Art

A typical method of manufacturing a radiation detector for an imaging device comprises applying a layer of a metal such as aluminum to both of the main surfaces of a planar semiconductor substrate, applying a layer of photoresistive material to cover the semiconductor material, exposing the photoresistive material on the surface of the planar substrate with an appropriate mask pattern, removing the photoresistive material to expose a pattern of the metal to be removed, etching away the metal to be removed, and then removing the remaining photoresistive material to leave a pattern of contacts on one surface of the substrate and a metallized layer on the other surface of the substrate. The contacts on the first surface of the substrate then define an arrangement of radiation detector cells.

For optical wavelengths and charged radiation (beta-rays), silicon has typically been used for the semiconductor material for the substrate. A method of the type described above has been used to good effect with this material.

In recent years, cadmium zinc telluride (CdZnTe) has increasingly been proposed as a more suitable semiconductor material for use in X-ray, gamma-ray and, to a lesser extent, beta-ray radiation imaging. CdZnTe is good at absorbing X-rays and gamma-rays, giving better than 90% efficiency for 100 keV X-rays and gamma-rays with a 2 mm thick detector. The leakage or dark current of these detectors can be controlled, and values on the order of 10 $nA/cm^2$ or less at 100 Volts bias are achievable.

A small number of companies worldwide currently produce these detectors commercially in a variety of sizes and thicknesses. Usually one or both sides of the planar detectors are contacted with a continuous metal layer such as gold (Au) or platinum (Pt). As mentioned above, such detector substrates then need to be processed to produce a detector having a pattern of contacts (e.g., pixel pads) on one surface, with the opposite surface remaining uniformly metallized, in order that the detector may be position sensitive (that is, in order that the detector is able to produce a detector output indicating the position at which radiation impacts the detector). A readout chip then can be "flip-chip" joined to the patterned side of the CdZnTe detector (e.g., by bump bonding using balls of indium or conductive polymer material, gluing using one-way conductive materials, or other conductive adhesive layer techniques) so that the position-dependent electrical signals which result from incidence and absorption in the detector cells of X-rays or gamma-rays can be processed. The readout chip could be of the pulse counting type with very fast integration and processing time (typically a few microseconds, or at most a few milliseconds). Alternatively, it may be one of a type described in the Applicants's International patent application PCT EP95/02056 which provides for charge accumulation for individual detector cells, the disclosure of which is expressly incorporated herein by reference. With an imaging device as described in PCT EP95/02056, integration times can be several milliseconds, or tens or hundreds of milliseconds. As the signal integration or standby/readout period increases it becomes more critical that the gold or platinum contacts on the CdZnTe surface are electrically separated to a high degree to avoid signals from neighboring contacts (pixel pads) leaking and causing the contrast resolution to degrade.

It has been found that traditional methods of forming contacts on a detector surface, particularly when CdZnTe is used as the semiconductor material, do not provide as high an electrical separation of the contacts as is desired to make optimum use of the advantages which are to be derived from the imaging devices as described in the International patent application PCT EP95/02056.

SUMMARY OF THE INVENTION

According to an embodiment of the present invention, a method for forming metal structures (e.g., metal contacts) on a semiconductor substrate at spaced positions (e.g., for defining radiation detector cells) includes the steps of forming one or more layers of material on a surface of the substrate with openings to the substrate surface at the contact positions; forming a layer of metal over the layer(s) of material and the openings; and removing metal overlying the layer(s) of material to separate individual contacts.

The present inventors have found that the surface resistivity of a CdZnTe semiconductor substrate is degraded when the substrate is exposed to metal etchants suitable for removing gold and/or platinum. As a result, the electrical separation of the individual contacts which result from the conventional method of forming such contacts is not as good as would be expected from the properties of that material before treatment. By using a method in accordance with the present invention, the surface of the semiconductor substrate between the contacts can be isolated from the metal etchants, thus preventing the damage which would result if the metal etchants came into contact with the semiconductor surface.

Thus, in this first embodiment, the step of forming one or more layers of material on a surface of the substrate with openings to the substrate surface at the contact positions may include the sub-steps of forming a layer of photoresistive material on the substrate surface; and selectively exposing the photoresistive material, and removing the photoresistive material from areas corresponding to the contact positions to expose the substrate surface.

Alternatively, this step may include the sub-steps of forming a layer of passivation material on the substrate surface; forming a layer of photoresistive material on the passivation layer; selectively exposing the photoresistive material, and removing the photoresistive material from areas corresponding to the contact positions to expose the passivation material layer; and removing the passivation material from the exposed areas corresponding to the contact positions to expose the substrate surface. The use of an insulating layer of passivation material means that after manufacture of the detector, the passivation material remains between the contacts, protecting the semiconductor surface from environmental damage in use and further enhancing the electrical separation of the contacts. To protect the other main surface and the sides (edges) of the semiconductor substrate, photoresistive material can additionally be applied to all exposed surfaces prior to the step of removing the passivation material from the exposed areas corresponding to the contact positions.

Again with reference to the above-referenced first embodiment, the step of removing metal overlying the layers of material to separate individual contacts may include the steps of forming a further layer of photoresistive material on at least the metal layer; selectively exposing the photoresistive material of the further layer, and removing the photoresistive material of the further layer apart from areas corresponding generally to the openings; and removing metal not covered by the photoresistive material of the further layer. In addition, any remaining photoresistive material may be removed. In a variation on this embodiment, the areas corresponding generally to the openings are larger than the corresponding openings, so that after removal of the metal not covered by the photoresistive material of the further layer, the contacts cover the opening and also extend up and laterally beyond the opening. In this way the ingress of metal etchant around the photoresistive material, whereby the metal etchant might reach the semiconductor surface, can be avoided.

The present invention is particularly useful with substrates formed of cadmium zinc telluride (CdZnTe). Nevertheless, persons skilled in the art will appreciate that methods according to embodiments of the present invention can readily be used with other substrate materials.

The metal layer for forming the contacts is preferably applied by sputtering, but other methods, including evaporation and electrolytic deposition, may also be used. The metal layer itself preferably comprises gold (Au), although other metals, such as platinum (Pt) or indium (In), may also be used. The passivation layer preferably comprises aluminum nitride (AlN).

Again with reference to the above-referenced first embodiment, the step of removing metal overlying the layers of material to separate individual contacts may comprise removing unwanted metal by a photoresist liftoff technique. More typically, however, removal of unwanted metal may be accomplished using an appropriate metal etchant.

According to another embodiment of the present invention, each metal contact can define a respective pixel cell of an array of pixel cells, or one of a plurality of strips arranged parallel to one another, depending on the application of the detector. Using a method according to the present invention, it is possible to configure metal contacts on the order of 10 $\mu$m across with a spacing on the order of 5 $\mu$m.

Yet another embodiment of the present invention provides a method of manufacturing a radiation detector comprising a semiconductor substrate with a plurality of metal contacts for respective radiation detector cells on a first surface thereof and layer of metallization on a surface of the substrate opposite to the first surface. The metal contacts may be formed on the first surface using a method such as the first embodiment described above. In such an implementation, the layer of metallization can be formed on the opposite surface of the substrate prior to applying a layer of material to the upper surface of the substrate.

Yet another embodiment of the present invention provides a method of manufacturing a radiation imaging device. According to this embodiment, a radiation detector may be manufactured using one of the methods referenced above. Individual contacts for respective detector cells may then be individually connected to corresponding circuits on a readout chip by, for example, a "flip-chip" technique.

According to another embodiment of the present invention, a radiation detector may be formed with a semiconductor substrate having a plurality of metal contacts for respective radiation detector cells on a first surface thereof and a layer of metallization on a surface of the substrate opposite to the first surface, wherein the overall width of the metal contacts is larger than the width of the contact adjacent the substrate.

The semiconductor substrate of the various embodiments referenced above is preferably made of cadmium zinc telluride (CdZnTe), although other materials, such as cadmium telluride (CdTe), may also be used. In addition, passivation material is preferably provided between individual contacts. Aluminum nitride has been found to be particularly effective as a passivation material for CdZnTe, which is temperature sensitive, because it can be applied at low temperatures.

Another embodiment of the present invention provides a radiation detector comprising a semiconductor substrate with a plurality of metal contacts for respective radiation detector cells on a first surface thereof and a layer of passivation material on the surface between the metal contacts, the passivation material comprising aluminum nitride. The metal contacts can define an array of pixel cells, or a plurality of strips arranged parallel to one another, depending on the field of use of the detector. Pixel contacts formed on a detector substrate are preferably substantially circular and arranged in a plurality of rows, with alternate rows ideally being offset from adjacent rows. The metal contacts may be on the order of 10 $\mu$m across with a spacing on the order of 5 $\mu$m. In detectors in accordance with embodiments of the present invention, the resistivity between metal contacts should be in excess of 1 G$\Omega$/square, preferably in excess of 10 G$\Omega$/square, more preferably in excess of 100 G$\Omega$/square, and even more preferably in excess of 1000 G$\Omega$/square (1 T$\Omega$/square).

Yet another embodiment of the present invention provides a radiation imaging device comprising a radiation detector as defined above and a readout chip having circuits for accumulating charge from successive radiation hits, with individual contacts for respective detector cells being connected by a "flip-chip" technique to respective circuits for accumulating charge. Such a radiation imaging device may be particularly useful for X-ray, gamma-ray and beta-ray imaging.

Another embodiment of the present invention provides a method of manufacturing, for example, detectors having a CdZnTe substrate with one side uniformly metallized with gold and the other side patterned with gold structures in a manner that does not adversely affect the surface characteristics of the CdZnTe substrate between the gold structures. Using such a method, it is possible to create gold structures on one side of a CdZnTe detector and achieve inter-structure resistivity on the order of G$\Omega$/square (or tens or hundreds of G$\Omega$/square).

The use of an electrically-insulating passivation layer between contacts further enables the area between metal contacts to be protected, thus giving a detector according to an embodiment of the present invention stable performance over time and avoiding effects such as oxidation which increase the surface leakage current and decrease the inter-contact resistivity. Aluminum nitride (AlN) passivation has been found to be particularly effective when applied between gold contacts to protect the surface and enhance the electrical separation of the gold contacts. The passivation layer of aluminum nitride can be implemented at relatively low temperatures, typically less than 100° C. By contrast, silicon oxide (SiO$_2$), which is typically used as a passivant for silicon (Si) semiconductors, needs temperatures in excess of 200° C. CdZnTe would be unusable after exposure to such temperatures.

DETAILED DESCRIPTION

Figure 1A:
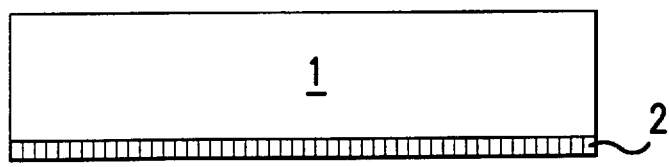
FIGS. 1A–1I illustrate in progressive fashion a method for forming metal contacts on a semiconductor substrate, according to an embodiment of the present invention.
Figure 1B:
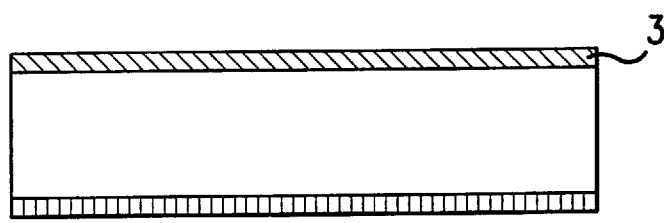
Figure 1C:
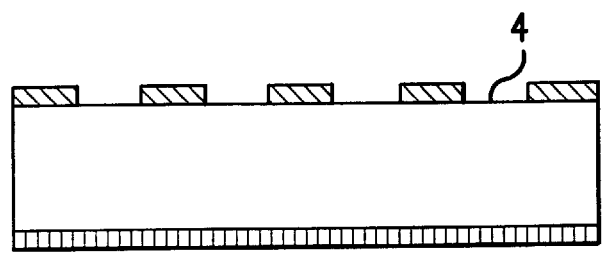
Figure 1D:
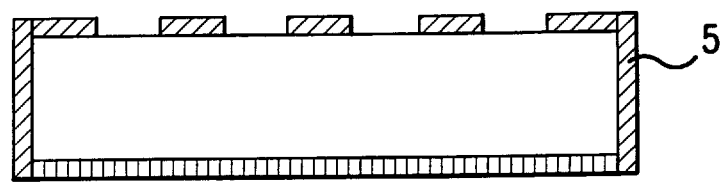
Figure 1E:
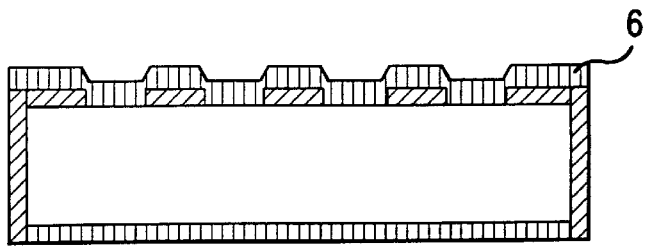
Figure 1F:
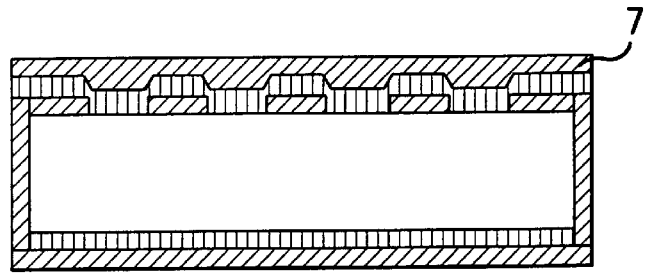
Figure 1G:
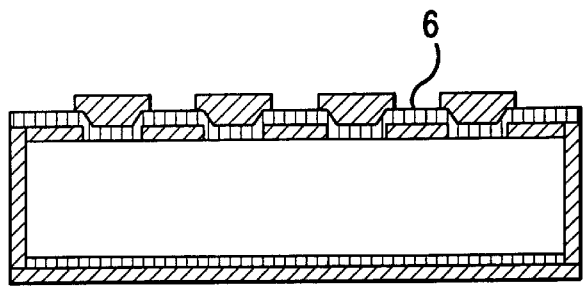
Figure 1H:
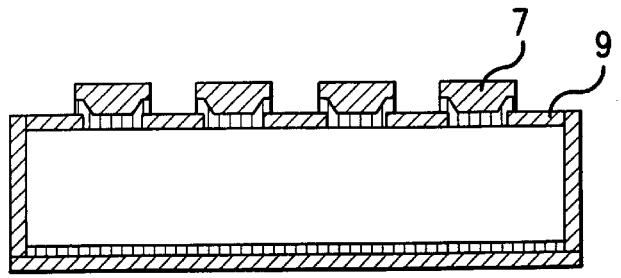
Figure 1I:
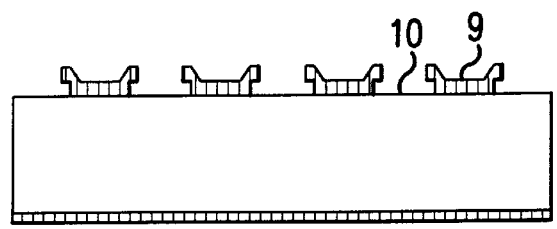

FIGS. 1A–1I illustrate in progressive fashion a method for forming metal contacts on a semiconductor substrate at positions for defining radiation detector cells, according to an embodiment of the present invention. The series of drawings presents schematic cross-sectional views from the side of a detector at various stages in the formation of metal contacts on a semiconductor substrate. In this embodiment, the semiconductor substrate is made of cadmium zinc telluride (CdZnTe), although other semiconductor materials, such as cadmium telluride (CdTe), may also be used. Likewise, the metal used for the metallization layer and the metal contacts is gold, although other metals, alloys or conductive materials, including platinum and indium, may also be used.

In the following description, various method steps are described with reference to a corresponding one of the series of FIGS. 1A–1I. For example, "Step A" corresponds to FIG. 1A, "Step B" corresponds to FIG. 1B, and so on.

Step A

A detector substrate 1 comprising, for example, CdZnTe, includes an upper face and a lower face. The lower face is uniformly metallized with gold 2.

Step B

Photoresistive material, or photoresist, is spun on the bare upper face of detector substrate 1 to form a first photoresist layer 3. The photoresist may be any of the common materials used in photolithography which are sensitive to certain light wavelengths for creating a pattern thereon.

Step C

Openings 4 are made in the first photoresist layer 3 using an appropriate mask or other conventional technique for removing photoresist according to a desired pattern.

Step D

Photoresist is also applied to the sides 5 of detector substrate 1 to protect them during consequent steps.

Step E

A gold layer 6 is sputtered, evaporated or laid by electrolysis uniformly over the first photoresist layer 3 and the openings 4, such that the gold layer 6 covers the first photoresist layer 3 and also contacts the CdZnTe upper surface of detector substrate 1 at the openings 4. The gold layer 6 and the uniformly metallized face 2 are electrically separated by photoresist on the sides 5 (edges) of detector substrate 1.

Step F

A second photoresist layer 7 is applied over the gold layer 6 and also over the uniformly metallized face 2.

Step G

Openings 8 are made in the second photoresist layer 7 corresponding to the areas of gold layer 6 that need to be removed (that is, the areas not in contact with the CdZnTe surface of detector substrate 1). Each area of photoresist which remains is larger than the corresponding area of the gold layer 6 in contact with the CdZnTe surface of detector substrate 1.

Step H

The unnecessary areas of gold layer 6 are etched away at openings 8 in the second photoresist layer 7 using a gold etchant. The second photoresist layer 7 protects the gold contacts 9 formed from portions of gold layer 6 which are in contact with the CdZnTe surface of detector substrate 1, since the photoresist is not sensitive to the etchant. As the area of photoresist which remains on the upper face of detector substrate 1 is larger than the corresponding area of gold layer 6 in contact with the CdZnTe surface, the etchant is prevented from reaching the CdZnTe surface, even at the interface between the gold layer 6 and the first photoresist layer 3.

Step I

The second photoresist layer 7 is removed, thus revealing the gold contacts 9; and the first photoresist layer 3 is removed, thus revealing the bare face 10 of the CdZnTe surface of detector substrate 1 between the gold contacts 9. The photoresist layer on the sides 5 and the lower face of the detector substrate 1 are also removed at this stage. No photoresist therefore remains on the CdZnTe surface of detector substrate 1. This is desirable because photoresist is usually hydroscopic material that in time would absorb humidity and degrade the performance of the detector.

As an alternative to Steps F–I above, the first photoresist layer 3 may be removed with the unwanted portions of gold layer 6 using a technique known as "liftoff." In this case, the unwanted portions of gold layer 6 may be removed without involving a second layer of photoresist and without using a gold etchant.

The end-result of the above-described method is a CdZnTe detector having a lower face 2 uniformly metallized with gold and an upper face metallized with gold contacts 9 in a desired pattern. The method advantageously ensures that gold etchant does not come into contact with the CdZnTe surface at any stage. The bare face 10 between the final gold contacts 9, or "pixel pads," thus remains totally unharmed and is not influenced by the gold etchant. As a result, the surface of the CdZnTe retains very high resistivity, in excess of 1 GΩ/square between gold pixel pads 9, and very low surface leakage current. As mentioned above, as high as possible resistivity between gold pixel pads 9 is desired in order to allow long integration, standby or readout times of the signal created from impinging X-rays and gamma-rays without deterioration of the image contrast resolution. With the above-described method, the inter-pixel resistivity can be tens, hundreds or even few thousands of GΩ/square without compromising pixel resolution. Indeed 300 GΩ/square has been measured and values in excess of a TΩ/square arc achievable. Moreover, using the above-described method, gold pixel pads 9 as small as 10 μm across with 5 μm spacing in between (i.e., 15 μm position sensitivity) can be readily obtained, while still retaining very high inter-pixel resistivity.

For at least some applications, it is desirable to add a passivation layer between each of the gold pixel pads to ensure a stable performance over time by avoiding oxidation of the surface not covered by gold. Passivation also enhances inter-pixel resistivity. One problem, however, is the compatibility of the passivation layer with respect to CdZnTe. The inventors have found that aluminum nitride is an appropriate passivation material for CdZnTe.

FIGS. 2A–2K illustrate in progressive fashion a method for forming metal contacts on a semiconductor substrate at positions for defining radiation detector cells with a layer of passivation material between the metal contacts, according to another embodiment of the present invention. The same materials may be used as those discussed with reference to the embodiment of FIGS. 1A–1I. In addition, the passivation material may comprise aluminum nitride, although other materials compatible with the substrate material could also be used. As in the discussion with reference to FIGS. 1A–1I, various method steps are described with reference to a corresponding one of the series of FIGS. 2A–2K.

Step A

A detector substrate 1 comprising, for example, CdZnTe, includes an upper face and a lower face. The lower face is uniformly metallized with gold 2.

Step B

A passivation layer 11 is formed by sputtering aluminum nitride on the bare CdZnTe upper face of detector substrate 1.

Step C

Photoresistive material, or photoresist, is spun on passivation layer 11, forming a first photoresist layer 12.

Step D

Openings 13 are made in the first photoresist layer 12 using an appropriate mask or other conventional technique for removing photoresist according to a desired pattern.

Step E

Photoresist is also applied to the sides 14 of detector substrate 1 to protect them during consequent steps.

Step F

Openings 15 are made through the passivation layer 11 using an aluminum nitride etchant to expose the CdZnTe surface of the detector substrate 1.

Step G

A gold layer 16 is sputtered, evaporated or laid by electrolysis uniformly over the first photoresist layer 12 and the openings 15, such that the gold layer 16 covers the first photoresist layer 12 and also contacts the CdZnTe upper surface of detector substrate 1 at the openings 15. The gold layer 16 and the uniformly metallized lower face 2 are electrically separated by the photoresist on the sides 14 (edges) of detector substrate 1.

Step H

A second photoresist layer 17 is applied over the gold layer 16 and the uniformly metallized lower face 2.

Step I

Openings 18 are made in the second photoresist layer 17 corresponding to the areas of gold layer 16 that need to be removed (that is, the areas not in contact with the CdZnTe surface of detector substrate 1). Each area of photoresist which remains is larger than the corresponding area of the gold layer 16 in contact with the CdZnTe surface of detector substrate 1.

Step J

The unnecessary areas 19 of gold layer 16 are etched away at openings 18 in the second photoresist layer 17 using a gold etchant. The second photoresist layer 17 protects the gold contacts 21 formed from portions of gold layer 16 which are in contact with the CdZnTe surface of detector substrate 1, since the photoresist is not sensitive to the etchant. As the area of photoresist which remains on the upper face of detector substrate 1 is larger than the corresponding area of gold layer 16 in contact with the CdZnTe surface, the etchant is prevented from reaching the CdZnTe surface, even at the interface between the gold layer 16 and the first photoresist layer 12.

Step K

The second photoresist layer 17 is removed, thus revealing the gold contacts 21; and the first photoresist layer 12 is removed, thus revealing the passivation layer 11 in the regions 20 between the gold contacts 21. The photoresist layer on the sides 14 and the lower face of the detector substrate 1 are also removed at this stage. No photoresist therefore remains on the CdZnTe surface of detector substrate 1. This is desirable because photoresist is usually hydroscopic material that in time would absorb humidity and degrade the performance of the detector.

The method of the foregoing embodiment advantageously ensures that neither gold etchant nor aluminum nitride etchant comes into contact with the regions 20 between the gold contacts 21 or the edges and sides of the CdZnTe surface of detector substrate 1. Consequently, during the above procedure the surface of the detector substrate 1 at the regions 20 between the gold contacts 21 remains unharmed, retaining very high resistivity on the order of G$\Omega$/square, tens, hundreds, or even thousands of G$\Omega$/square. The aluminum nitride passivation layer 11 covers the regions 20 between the gold contacts 21, protecting the corresponding regions from oxidation (providing stability over time) and enhancing inter-contact resistivity.

Numerous variations of the embodiment described above with reference to FIGS. 2A–2K are possible without departing from the spirit and scope of the present invention. For example, the first photoresist layer 12 may be removed prior to gold sputtering (after openings 15 have been made). This alternative method is illustrated progressively in FIGS. 3A–3L. Applying the same naming convention used above, Steps A–F (respectively illustrated in FIGS. 3A–3F) correspond to Steps A–F illustrated in FIGS. 2A–2F. The remaining method steps are described below.

Step G

Photoresist is removed from the upper face to expose the passivation layer 11 at regions 22.

Step H

This step corresponds generally to Step G of the previous embodiment (illustrated in FIG. 2G), except that here the gold layer 24 is applied over the passivation layer 11 at regions 22 and over the bare surface of detector substrate 1 at openings 23.

Steps I–L

These steps correspond generally to Steps H–K of the previous embodiment (illustrated in FIGS. 2H–2K), except for the absence of the first photoresist layer 12.

Figure 2A:
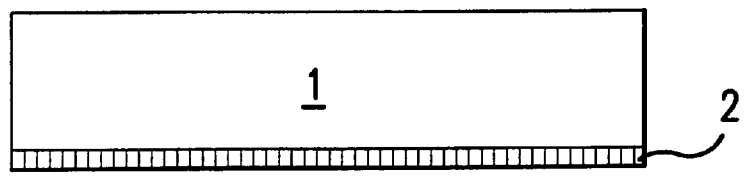
FIGS. 2A–2K illustrate in progressive fashion a method for forming metal contacts on a semiconductor substrate with a passivation layer between contacts, according to an embodiment of the present invention.
Figure 2B:
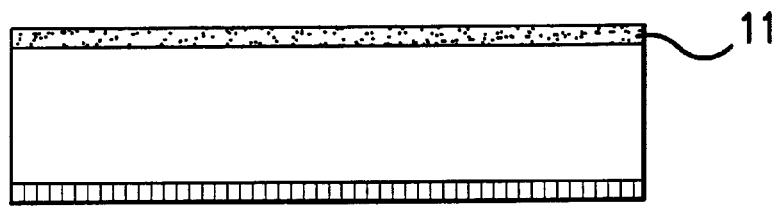
Figure 2C:
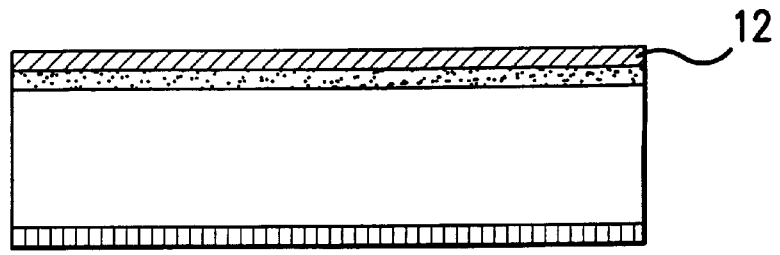
Figure 2D:
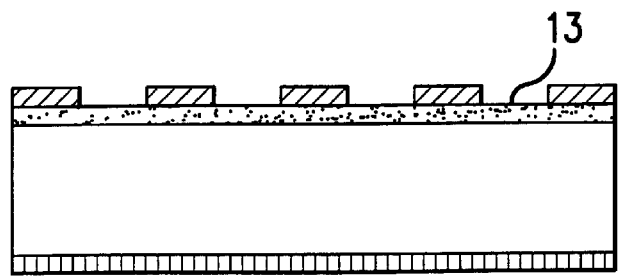
Figure 2E:
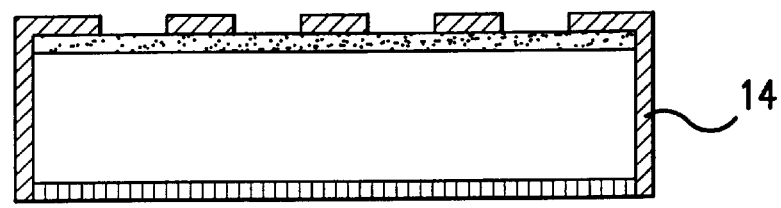
Figure 2F:
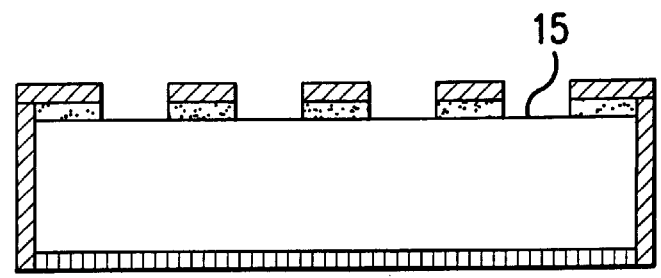
Figure 2G:
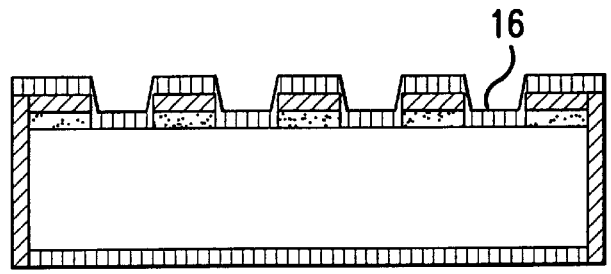
Figure 2H:
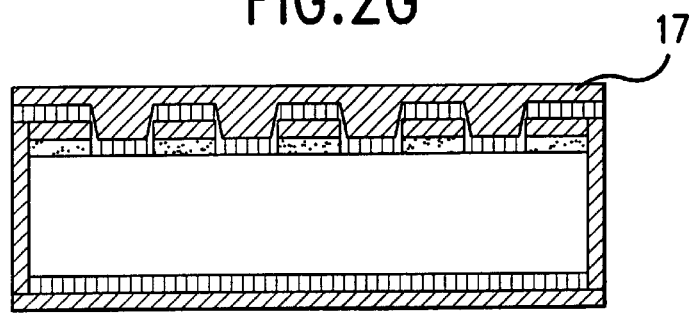
Figure 2I:
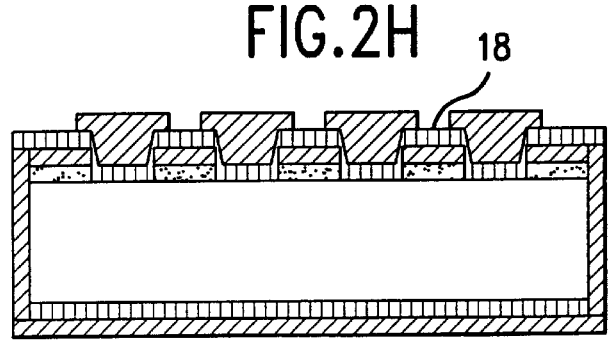
Figure 2J:
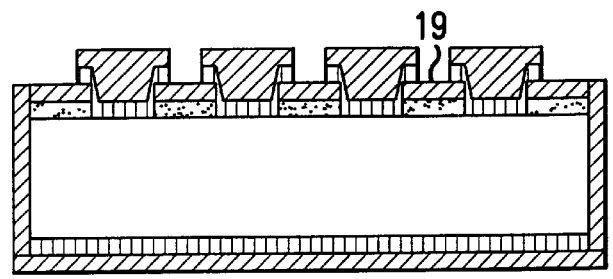
Figure 2K:
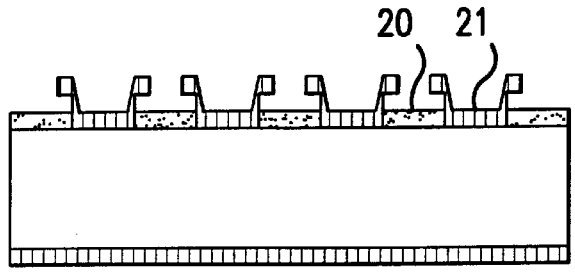
Figure 3A:
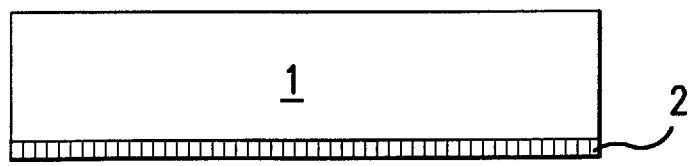
FIGS. 3A–3L illustrate in progressive fashion a second method for forming metal contacts on a semiconductor substrate with a passivation layer between contacts, according to an embodiment of the present invention.
Figure 3B:
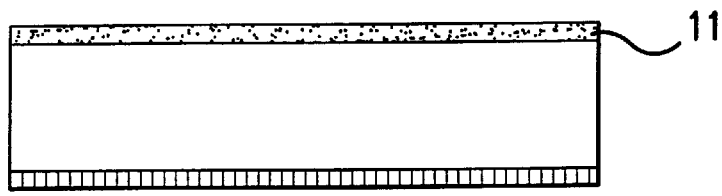
Figure 3C:
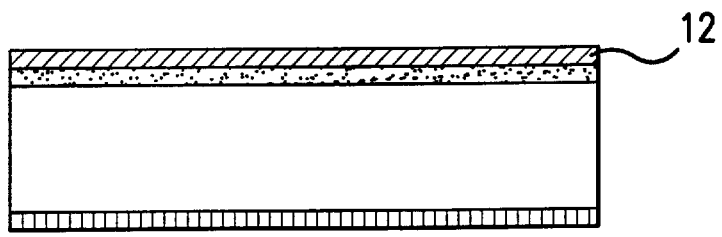
Figure 3D:
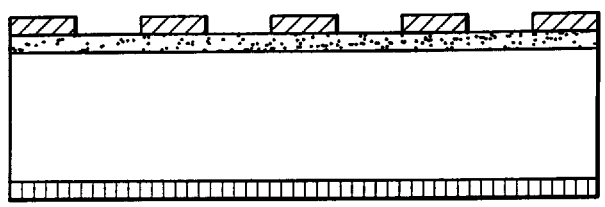
Figure 3E:
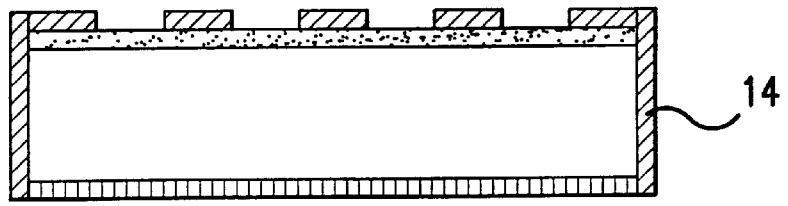
Figure 3F:
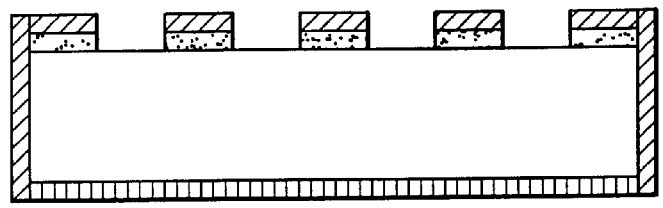
Figure 3G:
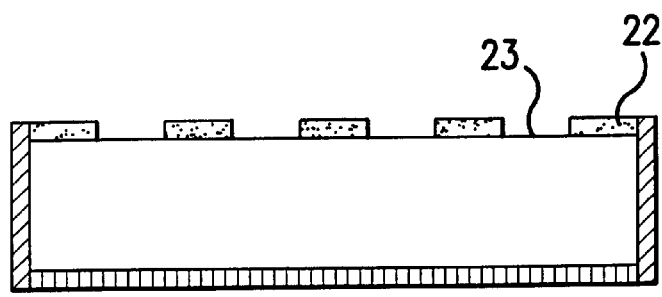
Figure 3H:
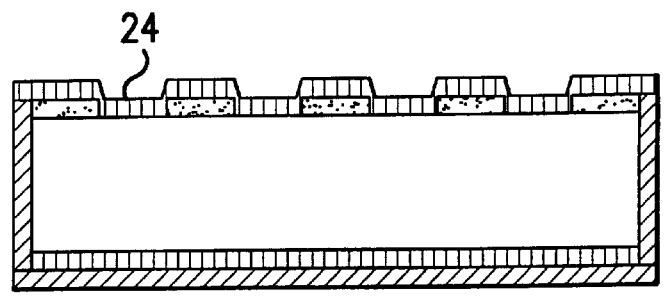
Figure 3I:
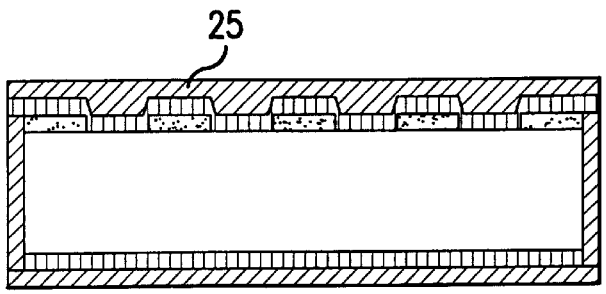
Figure 3J:
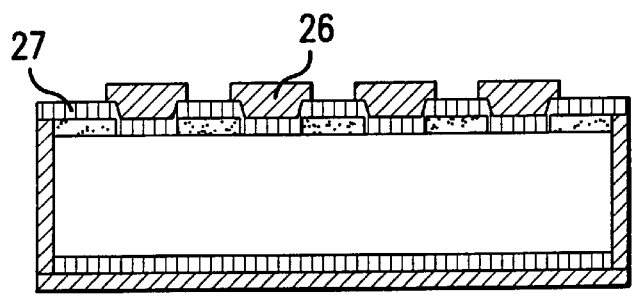
Figure 3K:
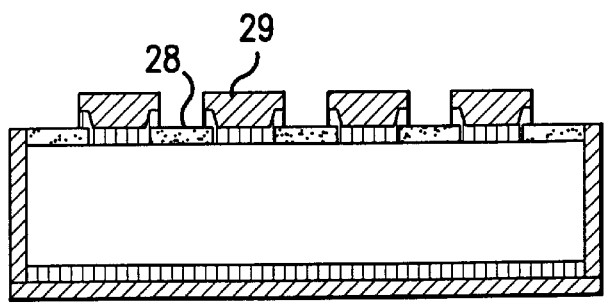
Figure 3L:
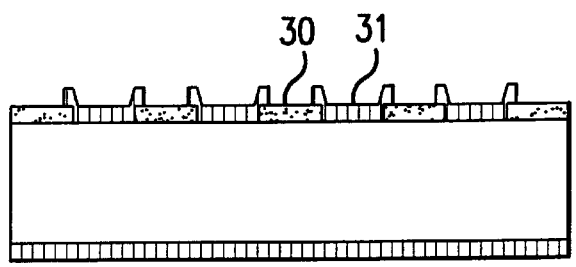

A result of the method illustrated in FIGS. 3A–3L is that the resultant pixel pads are flatter (i.e., they have a lower profile) than with the method of FIGS. 2A–2K, as can be seen by comparing FIG. 2K and FIG. 3L.

Figure 4:
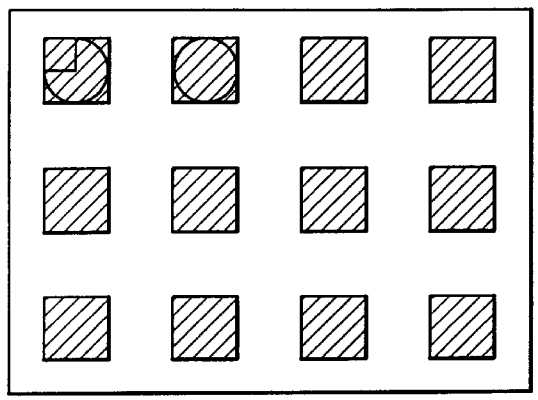
FIG. 4 is a schematic plan view of a first contact configuration on a detector substrate.
Figure 5:
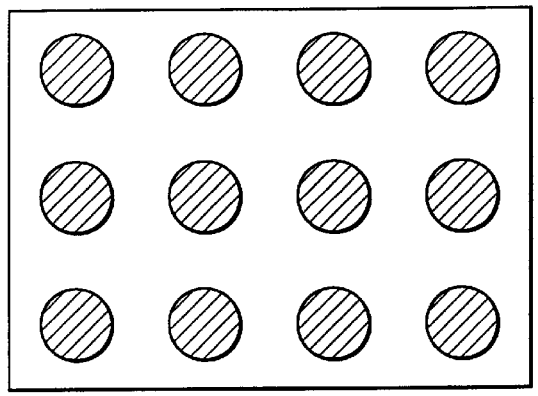
FIG. 5 is a schematic plan view of a second contact configuration on a detector substrate.
Figure 6:
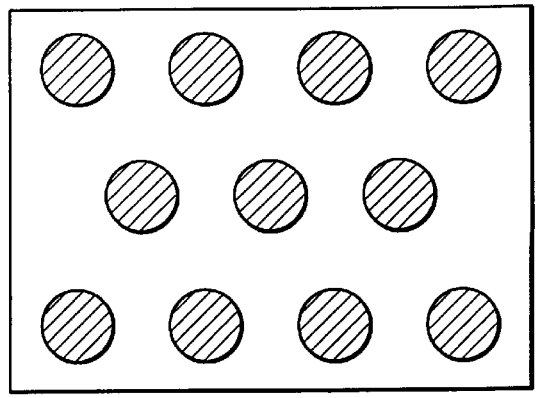
FIG. 6 is a schematic plan view of a third contact configuration on a detector substrate.
Figure 7:
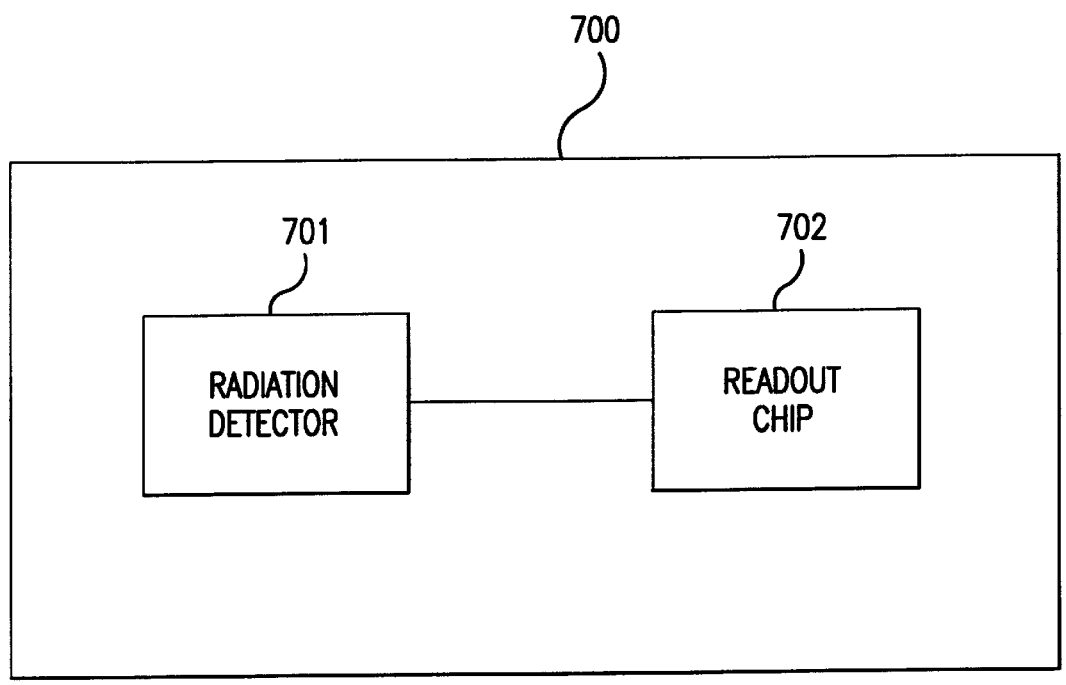
FIG. 7 is a schematic plan view of a radiation imaging device including a radiation detector and a readout chip.

FIGS. 4, 5 and 6 illustrate a number of possible pixel contact patterns disposed on the upper surface of a detector substrate. In FIG. 4, for example, an array of square pixel contact pads is arranged on a detector substrate. By contrast, FIG. 5 illustrates an array of circular pixel pads. The use of circular, rather than square, pixel pads increases the surface resistance between pads by increasing the amount of resistive material between adjacent pads. Similarly, FIG. 6 illustrates an array of offset (honeycombed) pixel pads. Once again, such an arrangement increases the resistance between pads by increasing the surface amount of resistive material between adjacent pads. Persons skilled in the art will recognize that, rather than providing an array of contacts for defining an array of pixel detector cells, embodiments of the present invention may be used to create other contact configurations, such as contact strips for defining strip-shaped detector cells.

In the foregoing embodiments, the metal contacts formed by the described methods are comprised of gold. Gold is an advantageous material for this purpose because it can be readily etched to define desired contact structures and give good contact (better than aluminum, for example) to the CdZnTe. Nevertheless, the foregoing embodiments could also be applied for any kind of metal contacts (e.g., platinum) for which an appropriate etchant is available.

As mentioned above, the longitudinal dimensions (width) of the top of the gold contacts 9 (FIG. 11), 21 (FIG. 2K) or 31 (FIG. 3L) is larger than that at the gold-substrate interface. This arises from the relative sizes of the openings to the substrate surface and the photoresist left over the portions for forming the contacts to ensure that, when redundant gold is etched away, the etchant will not seep through to the interface between the first photoresist layer (or the passivation layer) and gold in the openings.

According to yet another embodiment of the present invention, a radiation imaging device (700) may be constructed by connecting a radiation detector (701) (produced according to one of the methods described above) to a readout chip (702) having circuits for accumulating charge from successive radiation hits, with individual contacts (e.g., pixel pads) for respective detector cells being "flip-chip" joined (e.g., by bump bonding using balls of indium or conductive polymer material, gluing using one-way conductive materials, or other conductive adhesive layer techniques) to respective circuits for accumulating charge.

Thus, the present invention provides a method for obtaining a radiation detector (e.g., based on a CdZnTe substrate) with one side metallized according to a desired pattern with maximum possible electrical resistivity separation between the metal contacts. High resistivity between metal contacts is desirable to improve contrast resolution and eliminate signal leakage between adjacent metal contacts on the substrate surface. This is particularly advantageous when long charge accumulation times and long standby/readout times are employed by the readout chip. Such accumulation and standby/readout times could, for example, be in excess of I msec in implementations of imaging devices using a radiation detector manufactured according to an embodiment of the present invention. Such imaging devices find application, for example, in X-ray, gamma-ray and beta-ray imaging as described in the Applicant's International patent application PCT EP95/02056, the disclosure of which is expressly incorporated herein by reference.

Although particular embodiments of the present invention have been described above by way of example, persons skilled in the art will appreciate that additions, modifications and alternatives thereto may be envisaged within the spirit and scope of the invention.

What is claimed is:

1. A radiation detector comprising a semiconductor substrate for detecting radiation with a plurality of metal contacts for respective radiation detector cells on a first surface thereof and with a layer of conductive material on a second surface of said substrate opposite to said first surface, wherein said substrate is formed from cadmium zinc telluride semiconductor material for detecting x-rays, gamma-rays or beta-rays, said cell contacts and said layer of conductive material are on said first and second surfaces, respectively, of said semiconductor material and aluminum nitride passivation material extends between individual contacts on said first surface of said substrate.

2. A radiation detector comprising a semiconductor substrate for detecting radiation with a plurality of metal contacts for respective radiation detector cells on a first surface thereof and with a layer of conductive material on a second surface of said substrate opposite to said first surface, wherein said substrate is formed from cadmium telluride semiconductor material for detecting x-rays, gamma-rays or beta-rays, said cell contacts and said layer of conductive material are on said first and second surfaces, respectively, of said semiconductor material and aluminum nitride passivation material extends between individual contacts on said first surface of said substrate.

3. A radiation detector according to claim 1 or 2, wherein said metal contacts define an array of pixel cells.

4. A radiation detector according to claim 3, wherein said contacts are substantially circular and are arranged in a plurality of rows, with alternate rows being offset from adjacent rows.

5. A radiation detector according to claim 4, wherein said metal contacts define a plurality of strips arranged parallel to each other.

6. A radiation detector according to claim 1 or 2, wherein the resistivity between metal contacts is in excess of 10 GΩ/square.

7. A radiation detector according to claim 1 or 2, wherein at least one of said plurality of metal contacts comprises a rim upstanding from said first substrate surface.

8. A radiation imaging device comprising a radiation detector in accordance with claims 1 or 2 and a readout chip having a circuit for accumulating charge from successive radiation hits, individual contacts for respective detector cells being connected by a flip-chip technique to respective circuits for accumulating charge.

9. The radiation imaging device according to claim 8, wherein the radiation is one of the group consisting of X-ray, gamma-ray and beta-ray radiation.

10. A radiation detector comprising a semiconductor substrate for detecting radiation with a plurality of metal contacts for respective radiation detector cells on a first surface thereof and with a layer of conductive material on a second surface of said substrate opposite to said first surface, wherein said substrate is formed from cadmium zinc telluride semiconductor material for detecting x-rays, gamma-rays or beta-rays, said cell contacts and said layer of conductive material are on said first and second surfaces, respectively, of said semiconductor material and passivation material extends between individual contacts on said first surface of said substrate, and said metal contacts are of the order of 10 μm across with a spacing of the order of 5 μm.

11. A radiation detector comprising a semiconductor substrate for detecting radiation with a plurality of metal contacts for respective radiation detector cells on a first surface thereof and with a layer of conductive material on a second surface of said substrate opposite to said first surface, wherein said substrate is formed from cadmium telluride semiconductor material for detecting x-rays, gamma-rays or beta-rays, said cell contacts and said layer of conductive material are on said first and second surfaces, respectively, of said semiconductor material and passivation material extends between individual contacts on said first surface of said substrate, and said metal contacts are of the order of 10 μm across with a spacing of the order of 5 μm.

12. A radiation detector comprising a semiconductor substrate for detecting radiation with a plurality of metal contacts for respective radiation detector cells on a first surface thereof and with a layer of conductive material on a second surface of said substrate opposite to said first surface, wherein said substrate is formed from cadmium zinc telluride semiconductor material for detecting x-rays, gamma-rays or beta-rays, said cell contacts and said layer of conductive material are on said first and second surfaces, respectively, of said semiconductor material and passivation material extends between individual contacts on said first surface of said substrate, and the resistivity between metal contacts is in excess of 1 GΩ/square.

13. A radiation detector comprising a semiconductor substrate for detecting radiation with a plurality of metal contacts for respective radiation detector cells on a first surface thereof and with a layer of conductive material on a second surface of said substrate opposite to said first surface, wherein said substrate is formed from cadmium telluride semiconductor material for detecting x-rays, gamma-rays or beta-rays, said cell contacts and said layer of conductive material are on said first and second surfaces, respectively, of said semiconductor material and passivation material extends between individual contacts on said first surface of said substrate, and the resistivity between metal contacts is in excess of 1 GΩ/square.

14. A radiation detector according to claim 12 or 13, wherein the resistivity between metal contacts is in excess of 100 GΩ/square.

15. A radiation detector according to claim 12 or 13, wherein the resistivity between metal contacts is in excess of 1000 GΩ/square.

* * * * *